(12) United States Patent
Deng et al.

(10) Patent No.: US 7,738,795 B2
(45) Date of Patent: *Jun. 15, 2010

(54) VCSEL WITH INTEGRATED OPTICAL FILTER

(75) Inventors: Hongyu Deng, Saratoga, CA (US); Yuri V Vandyshev, San Jose, CA (US)

(73) Assignee: Finisar Corporation, Sunnyvale, CA (US)

(*) Notice: Subject to any disclaimer, the term of this patent is extended or adjusted under 35 U.S.C. 154(b) by 754 days.

This patent is subject to a terminal disclaimer.

(21) Appl. No.: 11/366,328

(22) Filed: Mar. 2, 2006

(65) Prior Publication Data

US 2007/0206959 A1 Sep. 6, 2007

(51) Int. Cl.
*H04B 10/04* (2006.01)
*H01S 5/00* (2006.01)

(52) U.S. Cl. .................... 398/182; 398/183; 398/186; 398/188; 398/201; 372/26; 372/50.124

(58) Field of Classification Search ............... 398/183, 398/182, 185, 186, 187, 188, 192, 199, 135, 398/138, 139, 201; 372/50.124, 54, 92, 97, 372/98, 99, 107, 6, 26, 20, 96
See application file for complete search history.

(56) References Cited

U.S. PATENT DOCUMENTS

| | | | |
|---|---|---|---|
| 2004/0136076 A1* | 7/2004 | Tayebati | 359/578 |
| 2005/0111845 A1* | 5/2005 | Nelson et al. | 398/138 |
| 2005/0111852 A1 | 5/2005 | Mahgerefteh et al. | |
| 2005/0271092 A1* | 12/2005 | Ledentsov et al. | 372/20 |
| 2006/0171437 A1* | 8/2006 | Takahashi | 372/50.124 |

* cited by examiner

*Primary Examiner*—M. R. Sedighian
(74) *Attorney, Agent, or Firm*—Workman Nydegger

(57) ABSTRACT

An example of an optical source includes a VCSEL and a filter. The filter is positioned on the VCSEL and is configured and arranged such that an input to the filter from the VCSEL comprises a directly modulated optical data signal, and a corresponding output of the filter comprises an amplitude and/or phase modulated optical data signal, optimized for long-distance transmission in the optical fiber.

20 Claims, 2 Drawing Sheets

VCSEL WITH INTEGRATED OPTICAL FILTER

BACKGROUND

1. The Field of the Invention

The present invention relates to Vertical-Cavity Surface-Emitting Lasers (VCSEL). More specifically, exemplary embodiments of the present invention relate to VCSELs with an integrated optical filter.

2. Related Technology

Computing and networking technology have transformed the world. As the amount of information communicated over networks has increased, high speed data transmission has become ever more critical. Many high speed data transmission networks rely on fiber optic networks, due to the large bandwidth of fiber optics and the ability of fiber optics to handle high speed data transmissions. Fiber optic networks are thus found in a wide variety of high speed applications ranging from as modest as a small Local Area Network (LAN) to those that form the backbone of the Internet.

Typically, data transmission in such networks is implemented in part through the use of an optical transmitter such as a laser. The optical transmitter emits light in response to a drive current and the intensity of the emitted light is a function of the current magnitude. Data reception in such networks is generally implemented by way of an optical receiver, an example of which is a photodiode. Particularly, the optical receiver receives an optical signal and generates a current, where the magnitude of the generated current is a function of the intensity of the received optical signal.

In many fiber optic networks, it is often desirable to use directly modulated laser (DML) sources as the optical transmitter in order to lower overall system cost. Examples of directly modulated lasers include Vertical-Cavity Surface-Emitting Lasers (VCSELs), Fabry-Perot (FP) lasers, Distributed Feedback (DFB) lasers, and Distributed Bragg Reflection (DBR) lasers.

Among directly modulated lasers, VCSELs are often the lowest cost to implement. The light forming cavity of a VCSEL is usually formed by epitaxially grown distributed Bragg reflectors, and the emission of laser light occurs in a direction that is normal to the laser epitaxial plane, or vertical. This vertical geometry enables high processing yield, low-cost on-wafer laser testing, and tight emission angles.

Commercial VCSELs for fiber optic communication applications commonly have operating wavelengths that are relatively short, near 850 nm, and thus have been limited to relatively short distance data communication through multi-mode fibers. It has proven much harder, however, to use VCSELs in fiber optic communication applications requiring wavelengths of 1310 nm and 1550 nm, which are more desirable wavelengths for single mode fiber long haul communication applications. More recently however, progress has been made in using VCSELs for long haul communication applications.

For traditional single mode fiber communications, directly modulated edge-emitting lasers such as FP, DFB, and DBR lasers have typically been used for applications requiring 1310 nm and 1550 nm wavelengths. Of the directly modulated edge-emitting lasers, FP lasers are typically the lowest cost to implement and are capable of multi-longitudinal mode emission. However, because of the fiber absorption and dispersion in the transmission fiber, FP lasers are generally limited to use for shorter distances, or in lower data rate applications over single mode fibers On the other hand, DFB and DBR lasers are relatively more complicated and expensive to make than FP lasers, but the single longitudinal mode behavior that results from a grating or a DBR mirror in the DFB and DBR laser active regions enables a light signal to propagate much further in single mode fibers than when using the FP laser.

Many directly modulated lasers, however, lack sufficient performance for higher speed and longer distance links such as, for example, at 10 Gb/s or greater and 40 km and above, due to a large chirp inherent in directly modulated lasers. In particular, the wavelength of the directly modulated lasers changes slightly when the lasers are modulated by signal data. This change in wavelength, or chirp, causes optical frequency distortion in the optical fiber, resulting in corruption of the transmitted data signal.

One approach to the chirp problem in high speed, long-haul applications is the use of electro-absorptive modulator lasers ("EML") or other light sources with external modulators to reduce the chirp and extend the distance. However, such an approach requires the use of expensive EML chip and packaging, or external modulators and electronic controls, which add to the overall cost of the system.

Another approach to the chirp problem is to use directly modulated lasers in conjunction with an external narrow-band optical filter to convert frequency modulation, or the chirp, to amplitude modulation. However, this approach of using an external optical filter with a DML is still very expensive to implement due to the complex packaging and additional equipment and electronic control of the system.

BRIEF SUMMARY

Embodiments disclosed herein relate to an optical source that reduces the cost of high speed, long-haul fiber optic communication systems. The optical source may be implemented, for example, in a Transmitter Optical Subassembly (TOSA) of an optical transceiver.

In an exemplary embodiment, an optical source includes a VCSEL and a filter. The filter is positioned on the VCSEL and is configured and arranged such that an input to the filter from the VCSEL comprises a directly modulated optical data signal, and a corresponding output of the filter comprises at least one of an amplitude modulated optical data signal, a phase modulated optical data signal, or a signal that incorporates both amplitude and phase modulation.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Exemplary embodiments described herein relate to optical sources including Vertical-Cavity Surface-Emitting Lasers (VCSEL) with an integrated filter. The VCSEL includes a top and bottom Distributed Bragg Reflector (DBR) mirror and an active region for generating wavelengths of light. In one example, the filter is implemented as a Fabry-Perot cavity that comprises top and bottom DBR mirrors between which an active region cavity is disposed. In some embodiments, the filter is epitaxially grown onto the same substrate as the VCSEL, and at the same time the VCSEL is grown. In other embodiments, the filter is grown onto the same substrate as the VCSEL during a subsequent regrowth process.

It was noted earlier that during operation, the VCSEL is directly modulated such that the VCSEL produces a chirp in the output signal. The integrated filter causes the directly modulated signal to be converted into an amplitude and/or phase modulation signal with a relatively narrow line-width. The amplitude and/or phase modulation signal may then travel at high speeds for long distances while experiencing little or no signal dispersion.

I. Exemplary Operating Environment

Figure 1:
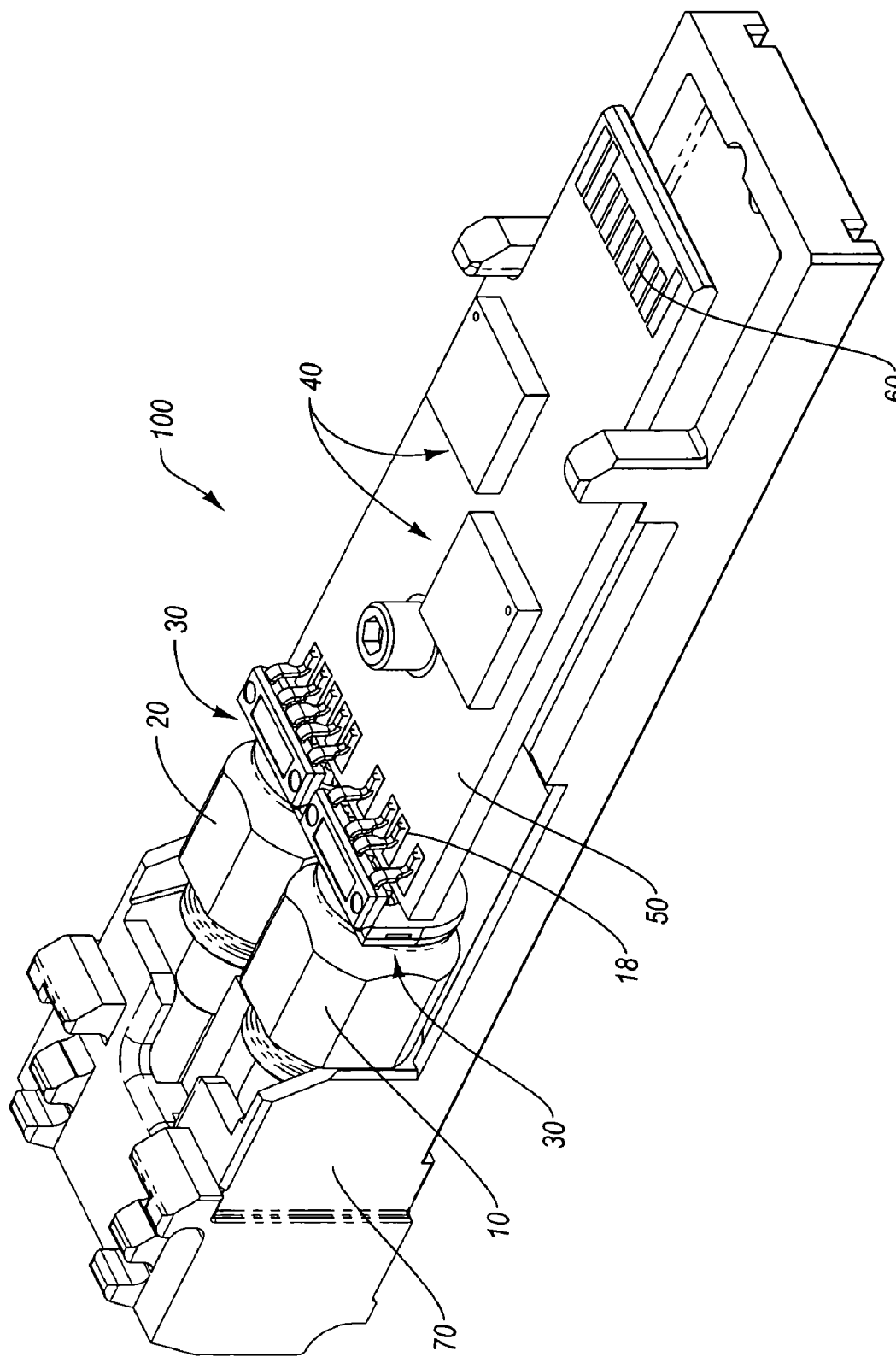
FIG. 1 is a perspective view of an example of an optical transceiver module.

Reference is first made to FIG. 1, which depicts a perspective view of an exemplary optical transceiver module ("transceiver"), generally designated at 100, for use in transmitting and receiving optical signals in connection with an external host that is operatively connected, in one embodiment, to a communications network. As shown, the transceiver shown in FIG. 1 includes various components, including a Receiver Optical Subassembly ("ROSA") 10, a Transmitter Optical Subassembly ("TOSA") 20, electrical interfaces 30, various electronic components 40, such as a laser-driver/a post-amplifier and control module for example, and a printed circuit board 50 which supports the electronic components 40.

In the illustrated embodiment, two electrical interfaces 30 are included in the transceiver 100, one each used to electrically connect the ROSA 10 and the TOSA 20 to a plurality of conductive pads located on the PCB 50. The electronic components 40 are also attached to the PCB 50. An edge connector 60 is located on an end of the PCB 50 to enable the transceiver 100 to electrically and mechanically interface with a host (not shown). In addition, the above-mentioned components of the transceiver 100 are partially housed within a housing 70. Though not shown, some embodiments include a shell that cooperates with the housing 70 to define an enclosure for components of the transceiver 100.

Figure 2:
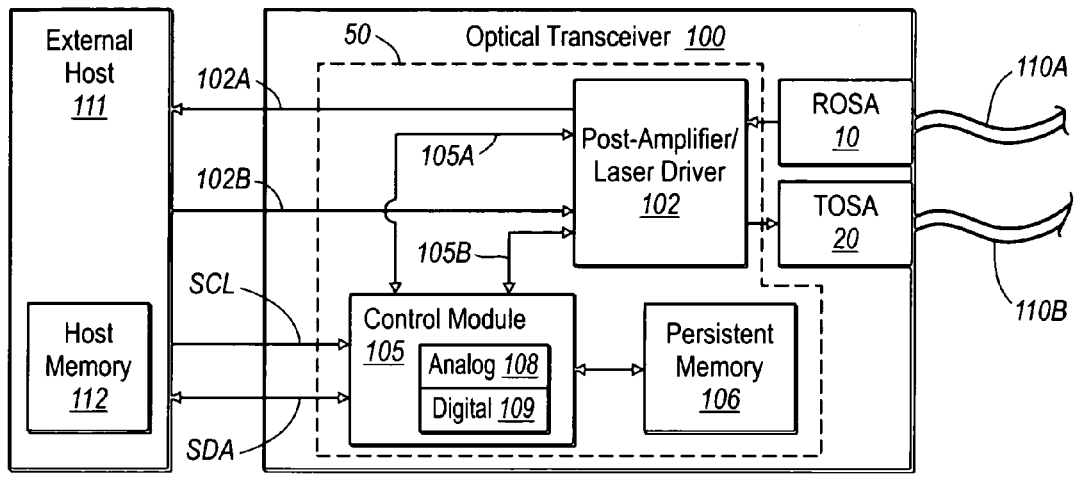
FIG. 2 is a simplified block view showing various aspects of the optical transceiver module of FIG. 1.

Reference is now made to FIG. 2, which is a simplified block diagram of an example of an optical transceiver, denoted at 100 in FIG. 1, depicting various physical and operational aspects of the transceiver. While the optical transceiver 100 will be described in some detail, the optical transceiver 100 is described by way of illustration only, and not by way of restricting the scope of the invention. As mentioned above, the optical transceiver 100 in one embodiment is suitable for optical signal transmission and reception at a variety of per-second data rates, including 1 Gbit/s, 2 Gbit/s, 4 Gbit/s, 10 Gbit/s, as well as even higher data rates. Furthermore, the embodiments described herein can be implemented in optical transceivers conforming with any of a variety of different form factors, examples of which include, but are not limited to, XFP, SFP and SFF, as well as a variety of different communication protocols, examples of which include, but are not limited to, GigE, SONET, and Fibre Channel.

With continuing reference to FIG. 2, and with reference as well to FIG. 1, transceiver 100 includes printed circuit board ("PCB") 50 on which the various electronic components of the transceiver are mounted. One such component is a control module 105. Control module 105 is connected to an integrated post-amplifier/laser driver ("PA/LD") 102 by connections 105A and 105B. These connections allow control module 105 to monitor the operation of the post-amplifier/laser driver 102 as will be described in more detail to follow. Control module 105 is connected to a persistent memory 106, which stores microcode for configuring control module 105 and is also used to store operational parameters. The control module 105 is also able to communicate with an external host 111 as depicted by the Serial Data line (SDA) and Serial Clock line (SCL).

Transceiver 100 includes both a transmit path and a receive path, both of which will now be described. The receive path includes ROSA 10, which transforms an incoming optical data signal into an electrical data signal. The electrical data signal is then provided to a post-amplifier portion of PA/LD 102. The post-amplifier amplifies and otherwise processes the electrical data signal and provides the electrical data signal to the external host 111 via connection 102A.

For the transmit path, external host 111 generates an electrical data signal and provides the electrical data signal to a laser driver portion of PA/LD 102 via connection 102B. The laser driver processes the electrical data signal and drives the TOSA 20, which causes the TOSA 20 to emit an optical data signal.

The operation of transceiver 100 will now be described in further detail. In operation, the optical transceiver 100, receives an optical data signal from a fiber 110A via the ROSA 10 in manner to be described more fully below. The ROSA 10 transforms the received optical data signal into an electrical data signal. The ROSA 10 provides the resulting electrical data signal to a post-amplifier. In the illustrated embodiment, the post amplifier is consolidated with the laser driver as an integrated PA/LD 102. As such, the PA/LD 102 resides on a single integrated circuit chip and is included as a component, together with the other electronic components 40, some of which are further described below, on PCB 50. In other embodiments, the post amplifier and laser driver are implemented as separate components on the PCB 50.

The post-amplifier portion of the PA/LD 102 amplifies the received electrical data signal and provides the amplified data signal to external host 111 over signal path 102A. The external host 111 may be any computing system capable of communicating with the optical transceiver 100. The external host 111 contains a host memory 112 that may be any volatile or non-volatile memory source. In one embodiment, some components of the optical transceiver 100 can reside on the host 111 while the other components of the transceiver reside on the PCB 50 separate from the host 111.

The optical transceiver 100 may also receive electrical data signals from the 111 for transmission onto a fiber 110B. Specifically, the laser driver portion of the PA/LD 102 receives the electrical data signal from the host 111 via the signal path 102B, and drives a light source within the TOSA 20. One example of a light source is a VCSEL that causes the TOSA 20 to emit onto the fiber 110B optical data signals representative of the information in the electrical data signal provided by the host 111.

The behavior of the ROSA 10, the PA/LD 102, and the TOSA 20 may vary dynamically due to a number of factors.

For example, temperature changes, power fluctuations, and feedback conditions may each affect the performance of these components. Accordingly, the transceiver 100 includes a control module 105, which may evaluate environmental conditions, such as temperature, age of the laser, and/or operating conditions, such as voltage, and receive information from the post-amplifier portion of the PA/LD 102 by way of connection 105A, and from the laser driver portion of the PA/LD by way of connection 105B. This arrangement allows the control module 105 to optimize the performance of the laser to compensate for dynamically varying conditions.

Specifically, the control module 105 optimizes the operation of the transceiver 100 by adjusting settings on the PA/LD 102 as represented by the connections 105A and 105B. These adjustments can be intermittent and are generally only made when temperature or voltage or other low frequency changes so warrant.

The control module 105 has access to a persistent memory 106, which in one embodiment, is an Electrically Erasable and Programmable Read Only Memory (EEPROM). Persistent memory 106 may also be any other non-volatile memory source. Persistent memory 106 is used to store microcode for configuring control module 105 and for storing operational parameters that have been measured by the control module 105. The persistent memory 106 and the control module 105 may be packaged together in the same package or in different packages without restriction.

Data and clock signals may be provided from the host 111 to the control module 105 using the SDA and SCL lines respectively. Also data may be provided from the control module 105 to the host 111 to allow for transmitting diagnostic data such as environmental and/or operational parameters. The control module 105 includes both an analog portion 108 and a digital portion 109. In this example, the analog portion 108 and the digital portion 109 collectively enable the control module to implement logic digitally, while still largely interfacing with the rest of the optical transceiver 100 using analog signals.

Having described an exemplary environment with respect to FIGS. 1 and 2, it will be understood that such environment is only one of countless architectures in which the embodiments described herein may be employed. As previously stated, the embodiments described herein are not intended to be limited to implementation in any particular environment.

II. Aspects of an Example Optical Source With a VCSEL and Integrated Filter

Figure 3:
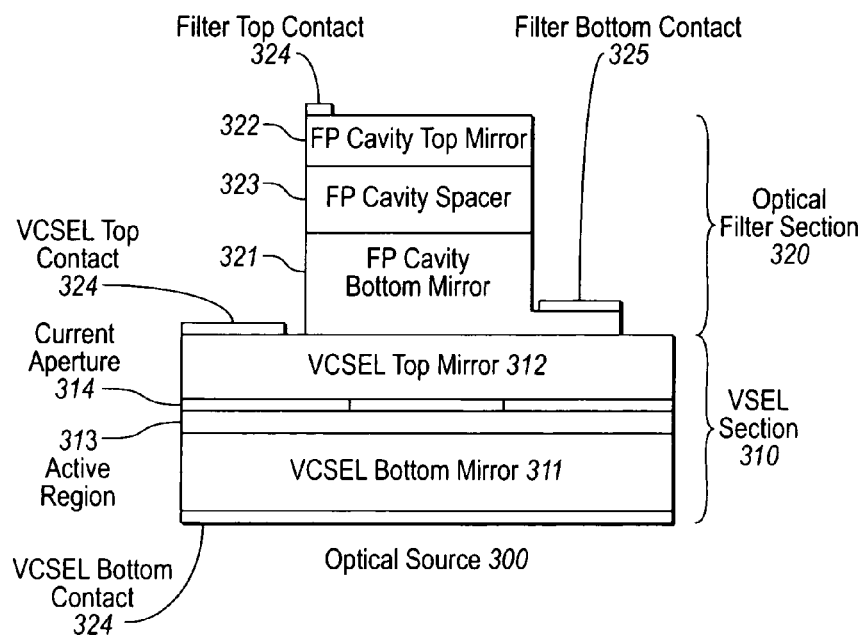
FIG. 3 is a schematic illustration of an example of an assembly that includes a VCSEL with an integrated optical wavelength filter.

Referring to FIG. 3, an example optical source, designated generally at 300, is disclosed. In general, the optical source 300 can be implemented in TOSA 20 of FIGS. 1 and 2 and acts as an optical transducer by converting electrical data signals into optical data signals.

In the illustrated example, optical source 300 includes a VCSEL section 310. The VCSEL section 310 includes a VCSEL bottom mirror 311 and a VCSEL top mirror 312. Situated between the bottom and top VCSEL mirrors is an active region 313. Coupled to the active region 313 and disposed between the active region 313 and the VCSEL top mirror 312 is a current aperture 314 through which current is guided to stimulate lasing in the active region 313. Finally, the VCSEL section 310 includes a VCSEL top contact 315 that may be used to provide voltage, biasing, and other control signals to the VCSEL.

The example optical source 300 also includes a filter section 320 that is supported by the VCSEL section 310. In at least some embodiments, the filter section 320 implements an optical filter. In the illustrated case, the filter section 320 is positioned directly on the VCSEL section 310 while, in other cases, intervening components, structures and/or layers may be interposed between the filter section 320 and the VCSEL section 310.

In the example embodiment illustrated in FIG. 3, the filter section 320 includes an FP cavity bottom mirror 321 and a FP cavity top mirror 322. Situated between the FP cavity bottom and top mirrors 321 and 322 is FP cavity spacer 323. The filter section 320 also includes a filter top contact 324 attached to FP cavity top mirror 322 and a filter bottom contact 325 attached to FP cavity bottom mirror 321.

There are various methods for positioning the filter section 320 on the VCSEL section 310. In at least some embodiments, the filter section 320 is epitaxially grown on the VCSEL section 310. Other methods of semiconductor manufacture may alternatively be employed however.

There are a wide variety of VCSEL configurations that may be implemented in connection with embodiments of the invention. Accordingly, the scope of the invention is not limited to the example VSCELs disclosed herein.

In one example embodiment, the VCSEL section 310 is implemented as a 1.55 µm VCSEL on a Gallium Arsenide (GaAs) substrate. In other embodiments, the VCSEL section 310 is implemented on an Indium Phosphate (InP) substrate. It will be appreciated that VCSEL section 310 is not limited to these particular substrates, but may be implemented on any suitable substrate.

With continuing attention to FIG. 3, more particular details will now be provided concerning the example VCSEL section 310 and filter section 320 outlined above. It should be noted however, that the VCSEL section 310 and filter section 320 are examples only and the scope of the invention is not limited to those examples.

As previously noted herein, the VCSEL section 310 includes a VCSEL bottom mirror 311 and a VCSEL top mirror 312 between which an active region 313 is positioned. In one example, the active region 313 comprises a 1.55 µm cavity, however, other active regions may alternatively be employed. In turn, the active region 313 is coupled to a current aperture 314 that serves to guide bias and modulation current to active region 313 so that photonic emission of light is stimulated in the active region 313.

Turning now to the mirrors of the VCSEL section 310 between which the active region 313 and current aperture 314 are positioned, the VCSEL bottom mirror 311 can, in general, be any type of mirror structure or material that is suitable for a VCSEL. In some particular embodiments, VCSEL bottom mirror 311 comprises a DBR mirror that includes approximately thirty pairs of quarter-wavelength thick alternating GaAs and Aluminum Gallium Arsenide (AlGaAs) layers. Because of the high refractive index contrast between the GaAs and AlGaAs layers, reflectivity well in excess of 99.9% can be achieved with the high number of pairs of DBRs.

As in the case of the VCSEL bottom mirror 311, the VCSEL top mirror 312 can be any type of mirror structure or material that is suitable for a VCSEL. In one example embodiment, the VCSEL top mirror 312 comprises a DBR mirror that includes approximately twenty pairs of quarter-wavelength thick alternating GaAs and AlGaAs layers.

Finally, the VCSEL section 310 includes a VCSEL top contact 315 and a VCSEL bottom contact 316. In general, VCSEL top contact 315 and/or VCSEL bottom contact 316 act as a connection node for receiving current that configures VCSEL section 310. By way of example, the VCSEL top and bottom contacts 315 and 316 can be used to provide bias and modulation currents, voltage or other control signals to VCSEL section 310 for tuning, biasing, and other purposes.

As noted earlier herein, the VCSEL section 310 of the example optical source 300 supports, and optically communicates with, a filter section 320. With continuing attention to FIG. 3, more particular details will now be provided concerning the example filter section 320.

As mentioned previously, filter section 320 can take various forms, examples of which include an FP cavity or any other structure(s) suited to implement the filter functionality disclosed herein. The filter section 320 is supported by, and in some cases, positioned directly on, the VCSEL section 310. Among other things, this arrangement enables lower cost packaging and operation.

In the illustrated example, the filter section 320 comprises an optical filter that includes an FP cavity bottom mirror 321 and an FP cavity top mirror 322. In this example, the FP cavity bottom mirror 321 and FP cavity top mirror 322 are implemented as DBR mirrors similar to those employed in the VCSEL top and bottom mirrors 311 and 312 of VCSEL section 310.

More particularly, in this embodiment, the FP cavity bottom mirror 321 comprises a DBR mirror that includes approximately thirty pairs of quarter-wavelength thick alternating GaAs and AlGaAs layers, while the FP cavity top mirror 322 comprises a DBR mirror that includes approximately twenty pairs of quarter-wavelength thick alternating GaAs and AlGaAs layers. Top and bottom mirrors 321 and 322 can also be any other type of mirror structure and/or material that is suitable for a FP cavity. Likewise, and as is the case with the VCSEL top and bottom mirrors of the VCSEL section 310, the number, geometry and arrangement of pairs and individual layers of the FP cavity bottom mirror 321 and/or the FP cavity top mirror 322 may be varied as desired.

With continued reference to FIG. 3, the FP cavity top mirror 321 and the FP cavity bottom mirror 322 are arranged such that an FP cavity spacer 323 is situated therebetween. The FP cavity spacer 323 may comprise any material(s) of suitable thickness and/or other geometric features to provide the required resonance of a desired wavelength of light. In one embodiment, the FP cavity spacer 323 comprises GaAs, but the scope of the invention is not limited to those example materials and various other materials may alternatively be employed. The required resonance can be controlled, for example, by the epitaxial growth process of the FP cavity and/or the VCSEL.

Finally, the illustrated embodiment of the filter section 320 includes a filter top contact 324 situated on the FP cavity top mirror 322, and a bottom contact 325 situated on the FP cavity bottom mirror 321. Among other things, the filter top contact 324 and filter bottom contact 325 can be used to provide current, voltage or control other signals to filter section 320 for tuning, biasing, and other purposes.

For example, the FP cavity spacer 323 may be combined with a p-n junction such that an adjustment to the current provided to filter section 320 through filter top contact 324 or filter bottom contact 325 enables the fine tuning of the cavity resonance of filter section 320 to optimize high speed performance of, and adjust for signal changes due to aging of, the VCSEL section 310 and the filter section 320.

III. Operational Aspects of an Exemplary Optical Source Including a VCSEL with Integrated Optical Filter Having disclosed herein one example structure of optical source 300, it is noted that the aforementioned implementation of the optical source is only one of a variety of possible structures and, accordingly, the example implementations disclosed herein should not be construed to limit the scope of the claims in any way. Aspects of the operation of the exemplary optical source 300 will now be considered.

In operation, the VCSEL section 310 receives bias and modulation currents from a transceiver or other system laser driver circuit, such as the laser driver portion of post-amplifier/laser driver 102 of FIG. 2. For example, in order to assert one binary value, a relatively low bias current is passed through active region 313 so that a relatively low optical power level is transmitted onto an optical fiber. In order to assert the opposite binary value, a relatively high current is passed through active region 313 so that a signal of a relatively high optical power level, particularly, the bias current plus a maximum modulation current, is transmitted onto an optical fiber.

Accordingly, by superimposing a modulation current that varies between zero and the maximum modulation current upon the bias current, an appropriate sequence of bits may be transmitted. As previously mentioned, however, superimposing the modulation current on the bias current causes a chirp to occur in the signal. This chirp makes the wavelength of the emitted light wave unstable and thus causes signal dispersion at high data rates and/or long distances.

The chirped signal that is produced by the VCSEL section 310 is then passed to the filter section 320. Note that filter section 320 is capable of producing a phase modulated signal, an amplitude modulated signal, or an optical data signal that incorporates both amplitude and phase modulation. Optical data signals incorporating both phase and amplitude modulation are particularly favorable for long haul optical transmission applications. For example, as disclosed herein, filter section 320 is constructed so as to be biased to a desired wavelength resonance, and acts as a narrow-band optical wavelength filter by passing only the desired wavelength of the VCSEL d signal, while attenuating the remaining wavelengths. The desired wavelength of the VCSEL directly modulated signal that is passed is thus turned into an amplitude and/or phase modulation signal by the filter section 320. The filter section 320 then provides the amplitude and/or phase modulation signal to an optical fiber. The amplitude and/or phase modulation signal can be transmitted at high data rates and/or long distances while experiencing little or no signal dispersion.

Among other things, use of the optical source 300 allows for long haul communication signals having a data rate that is equal to or greater than 10 Gb/s and that propagate for a distance equal to or greater than 120 Km, while experiencing little or no signal dispersion. In addition, use of optical source 300 allows for long haul signals having a data rate of 10 Gb/s that propagate for 80 to 120 Km while experiencing little or no signal dispersion.

Other useful aspects of the optical source 300 concern the proximity of the VCSEL section 310 and the filter section 320. Particularly, the relatively close proximity of the DML 310 with the filter 320 means that the temperature of the two is essentially the same, and therefore the spectral matching spectral matching of the VCSEL section 310 and filter section 320 will largely be maintained, regardless of external temperature. Among other things, the thermal relation between the VCSEL section 310 and the filter section 320 in this example obviates the need for expensive temperature controllers, thus lowering overall system costs and simplifying system construction.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical source comprising:
   a directly modulated Vertical-Cavity Surface-Emitting Laser (VCSEL), including:
   a bottom mirror;
   a top mirror; and
   an active region between the bottom mirror and top mirror; and
   a filter positioned in a fixed position on the VCSEL above the top mirror of the VCSEL, the filter including a top contact and a bottom contact and configured to allow modulation of light passing through the filter, where an input to the filter from the VCSEL comprises a directly modulated optical data signal, and a corresponding output of the filter comprises at least one of an amplitude modulation optical data signal, a phase modulation optical data signal, or an optical data signal that incorporates both amplitude and phase modulation.

2. An optical source in accordance with claim 1, wherein the filter comprises a Fabry-Perot cavity comprising:
   a bottom mirror section, positioned in the fixed position directly on top of the top mirror of the VCSEL;
   a top mirror section; and
   a lasing cavity spacer region interposed between the top and bottom mirror sections.

3. An optical source in accordance with claim 2, wherein at least one of the top and bottom mirror sections comprises a Distributed Bragg Reflector.

4. An optical source in accordance with claim 1, wherein the filter comprises a tunable filter such that a change in the input modulated optical data signal corresponds to a change in a predetermined characteristic of the filter.

5. An optical source in accordance with claim 1, wherein the filter and directly modulated VCSEL are substantially spectrally matched with each other at an operating temperature of the optical source.

6. An optical source in accordance with claim 1, wherein the filter comprises an integrated optical filter.

7. An optical source in accordance with claim 1, wherein the VCSEL includes a top mirror upon which the filter is positioned.

8. A Transmitter Optical Subassembly (TOSA) comprising:
   a directly modulated VCSEL, including:
   a bottom mirror;
   a top mirror; and
   an active region between the bottom mirror and top mirror;
   a filter positioned in a fixed position on the top mirror of the VCSEL, the filter including a top contact and a bottom contact and configured to allow modulation of light passing through the filter, where an input to the filter from the VCSEL comprises a directly modulated optical data signal, and a corresponding output of the filter comprises at least one of an amplitude modulation optical data signal, a phase modulation optical data signal, or an optical data signal that incorporates both amplitude and phase modulation;
   a transmit node coupled to the filter and configured to transmit an optical signal to an optical fiber; and
   a connection node coupled to the VCSEL and configured to receive one or more electrical signals for configuring the VCSEL.

9. A TOSA in accordance with claim 8, wherein the filter comprises a Fabry-Perot cavity comprising:
   a bottom mirror section;
   a top mirror section; and
   a lasing cavity spacer region interposed between the top and bottom mirror sections.

10. A TOSA in accordance with claim 8, wherein at least one of the top and bottom Fabry-Perot mirror sections comprises a distributed Bragg reflector.

11. A TOSA in accordance with claim 8, wherein the filter comprises a tunable filter such that a change in the input modulated optical data signal corresponds to a change in a predetermined characteristic of the filter.

12. A TOSA in accordance with claim 8, wherein the filter and directly modulated VCSEL are substantially spectrally matched with each other at an operating temperature of the optical source.

13. A TOSA in accordance with claim 8, wherein the filter comprises an integrated optical filter.

14. A TOSA in accordance with claim 8, wherein the VCSEL includes a top mirror upon which the filter is positioned.

15. An optical transceiver comprising:
   a Receiver Optical Subassembly (ROSA) configured to receive an optical signal and generate a corresponding electrical signal;
   a post-amplifier configured to process the electrical signal generated by the ROSA; and
   a Transmitter Optical Subassembly (TOSA) configured to transmit an optical signal to an optical fiber, and the TOSA comprises:
   a directly modulated Vertical-Cavity Surface-Emitting Laser (VCSEL), including:
   a bottom mirror;
   a top mirror; and
   an active region between the bottom mirror and top mirror; and
   a filter positioned on the VCSEL, the VCSEL including a bottom mirror section in direct contact with the top mirror of the VCSEL, the filter including a top contact and a bottom contact and configured to allow modulation of light passing through the filter, where an input to the filter from the VCSEL comprises a directly modulated optical data signal, and a corresponding output of the filter comprises at least one of an amplitude modulation optical data signal, a phase modulation optical data signal, or an optical data signal that incorporates both amplitude and phase modulation; and a laser driver configured to provide electrical signals to the TOSA.

16. An optical transceiver in accordance with claim 15, wherein the optical transceiver is one of a 1 Gb/s laser transceiver, a 2 GB/s laser transceiver, a 4 Gb/s laser transceiver, a 8 Gb/s laser transceiver, or a 10 Gb/s laser transceiver.

17. An optical transceiver in accordance with claim 15, wherein the optical transceiver substantially conforms with one of the following form factors; XFP; SFP; SFF.

18. An optical transceiver in accordance with claim 15, wherein the filter comprises an integrated optical filter.

19. An optical transceiver in accordance with claim 15, wherein the filter comprises a Fabry-Perot cavity comprising:
   a bottom mirror section;
   a top mirror section; and
   a lasing cavity spacer region interposed between the top and bottom mirror sections.

20. An optical transceiver in accordance with claim 15, wherein the filter and VCSEL are substantially spectrally matched with each other at an operating temperature of the VCSEL.

* * * * *